United States Patent [19]

Noonan et al.

[11] 3,833,384

[45] Sept. 3, 1974

[54] PHOTOPOLYMERIZABLE COMPOSITIONS AND ELEMENTS AND USES THEREOF

[75] Inventors: John M. Noonan; Richard C. Sutton; Robert C. McConkey, all of Rochester, N.Y.

[73] Assignee: Eastman Kodak Company, Rochester, N.Y.

[22] Filed: Apr. 6, 1973

[21] Appl. No.: 348,578

Related U.S. Application Data

[63] Continuation-in-part of Ser. No. 247,747, April 26, 1972.

[52] U.S. Cl. .................... 96/115 P, 96/35.1, 96/36, 96/36.3, 96/86 P, 204/151.15, 204/159.16

[51] Int. Cl. .................................. G03c 1/68

[58] Field of Search ................. 204/159.15, 159.16; 260/47 UA, 479 R; 96/115 P, 115 R, 86 P

[56] References Cited

UNITED STATES PATENTS

| | | | |
|---|---|---|---|
| 3,017,383 | 1/1962 | Lappin | 260/479 R |
| 3,607,292 | 7/1969 | Cerwonka | 96/115 P |
| 3,632,493 | 1/1972 | Rogers | 260/47 UA |
| 3,661,576 | 5/1972 | Crary | 95/115 P |
| 3,730,951 | 5/1973 | Braude | 204/159.16 |
| 3,748,133 | 7/1973 | Noonan et al. | 96/115 P |

*Primary Examiner*—Ronald H. Smith
*Assistant Examiner*—Edward C. Kimlin
*Attorney, Agent, or Firm*—Mr. James L. Lewis

[57] ABSTRACT

Novel photopolymerizable compositions comprise an ethylenically unsaturated monomer which is a bisacryloyl derivative of p- or m-hydroxy or amino benzoic acid, a film-forming carboxylated polymeric binder and a photoactivatable polymerization initiator. These compositions are easily developed with alkaline solutions and can be used to prepare resists, printing plates, and other photomechanical images. Terpolymer binders of methyl methacrylate, ethyl acrylate and methacrylic acid present in proportions of from 40 to 65 percent, 20 to 45 percent and 10 to 25 percent, respectively, on a mole basis, have been found to produce resist compositions of exceptionally clean developing characteristics which are substantially free of microresidues.

17 Claims, No Drawings

PHOTOPOLYMERIZABLE COMPOSITIONS AND ELEMENTS AND USES THEREOF

This application is a continuation-in-part of our copending application Ser. No. 247,747, filed Apr. 26, 1972.

This application relates to photosensitive compositions and elements and to methods of using such materials to prepare photomechanical images. In a particular aspect it relates to photopolymerizable compositions and elements and to their use in the preparation of photoresist images and printing plates.

In a more specific aspect this invention relates to photopolymerizable compositions and elements exhibiting exceptionally clean developing characteristics.

Photopolymerizable compositions have been the subject of increasing interest in recent years. Such compositions typically comprise a monomer containing unsaturated sites which are capable of undergoing addition polymerization, and a photoactivatable polymerization initiator. Preferred monomers have one or more terminal carbon to carbon double bonds, and have been referred to in the art as ethylenically unsaturated monomers. The photopolymerization initiator is a compound, or mixture of compounds, which produces free radicals on exposure to actinic radiation and which in its excited state will react with the double bond on the monomer to initiate polymerization. Preferably, these compositions contain binders to provide a solid layer when the compositions are coated and, optionally, they contain sensitizers which increase the photographic speed of the compositions or extend their range of spectral response, or both, and thermal polymerization inhibitors which prolong the shelf life of the compositions, as well as other addenda such as dyes, pigments and the like.

Such compositions have generally been employed in the photographic arts to prepare photomechanical images for use as etching or plating resists, relief and planographic printing plates and the like. These reproduction processes make use of the difference in solubility and softening point which occurs upon exposure of the composition to actinic radiation and resultant polymerization of the monomer. Thus, in a typical process a layer of the photopolymerizable composition is exposed imagewise to actinic radiation to effect polymerization of the monomer in exposed areas and an image is developed by solvent washout of unexposed areas, thermal transfer of unexposed areas, or similar procedures. Representative photopolymerizable compositions and processes for employing them to prepare photomechanical images are described in such patents as U.S. Pat. Nos. 2,760,863, 3,060,023, 3,346,383, 3,353,955, 3,458,311, 3,469,982.

We have found novel photopolymerizable compositions which give tough, non-brittle, abrasion-resistant photomechanical images. These compositions can be used to prepare photoresists and printing plates by solvent development or thermal transfer processes, as well as to prepare other types of photographic images for which photopolymerizable compositions have typically been used. The compositions of this invention are readily developed with aqueous alkaline solutions, thus eliminating the need for hazardous organic solvents, such as chlorinated hydrocarbons, typically employed as developer solvents.

It has heretofore been recognized in the art that, although photoresist compositions can be removed with developing solutions, they leave behind microresidues. These are thin discontinuous layers seldom in excess of a few molecules in thickness and characteristically less than 100 Angstroms in thickness. For most applications to which photoresists are applied these microresidues can be ignored, since they produce no significant adverse effect. In a few applications, however, even microresidues can produce adverse results. For example, where a photoresist layer is removed from a metal surface by development solutions, conventional photoresists leave behind a microresidue that must be removed by an etchant before an adherent metal layer can be plated onto the metal surface. Typically a strong acid or alkaline etchant is employed. The necessity of using such an etchant after photoresist development is disadvantageous for several reasons. First, the use of strongly acid or alkaline solutions can be hazardous to personnel. Second, at least one and typically several additional steps are introduced into the total fabrication procedure. Third, a portion of the metal forming the substrate for plating is removed. This represents an economic loss in terms of metal wasted and a significant ecological burden in disposing of metal contaminated solutions.

It is an object of this invention to provide novel photopolymerizable compositions comprising a photopolymerizable monomer, a polymeric binder and a photoactivatable polymerization initiator, which compositions are easily developed with aqueous alkaline solutions.

It is another object of this invention to provide novel photosensitive elements employing the photopolymerizable compositions of the present invention.

It is a further object of this invention to provide novel photoresist compositions and lithographic printing plates employing the photopolymerizable compositions of this invention.

It is an additional object of this invention to provide photoresist compositions of exceptionally clean developing characteristics which are substantially free of microresidues.

It is another object of this invention to provide processes for preparing photomechanical images employing the photopolymerizable compositions of this invention.

The above and other objects of this invention will become apparent to those skilled in the art from the further description of the invention which follows.

In accordance with the present invention there is provided a photopolymerizable composition comprising an ethylenically unsaturated monomer which is a bisacryloyl derivative of a p- or m-hydroxy or amino benzoic acid, a film-forming carboxylated polymeric binder, a photoactivatable polymerization initiator, and, optionally, such components as thermal polymerization inhibitors, sensitizers, and the like.

The bisacryloyl derivatives of p- or m-hydroxy or amino benzoic acids include compounds which have attached thru the carboxy group, substituents which are terminated with acryloyl groups, e.g., acrylates, acrylamides, methacrylates and methacrylamides, and which have attached para or meta to the carboxy group, acryloyl groups or substituents which are terminated with acryloyl groups. Preferred ethylenically unsaturated monomers are the bismethacrylates of p-hydroxy benzoic acid, i.e., those compounds which have attached thru the carboxy group, a substituent terminated with a methacrylate group and which have para to the carboxy group, a methacrylate group or a substituent terminated with a methacrylate group.

The polymeric binders are selected so that the photopolymerizable composition is initially soluble in dilute aqueous alkaline solutions, but upon exposure to actinic radiation becomes insoluble therein. Typically, polymers which satisfy these criteria are carboxylated, e.g., vinyl addition polymers containing free carboxylic acid groups. Preferred polymeric binders are polymers of 30 to 94 mole percent of one or more alkyl acrylate, including alkyl methacrylate, monomers and 70 to 6 mole percent of one or more $\alpha$, $\beta$-ethylenically unsaturated carboxylic acids.

The photopolymerizable compositions of the present invention can be used to prepare tough, non-brittle, and extremely abrasion resistant coatings which have few or no pinholes, thus making them highly suitable for the preparation of photoresists. Images can be developed from these coatings using aqueous alkaline developer compositions, and once the image has served its purpose, it is readily removed with strong alkalis. Hence, these compositions avoid the use of hazardous organic solvents. Good image definition is obtained with even relatively thick coatings of these compositions. Surprisingly, it has been found that these compositions do not suffer from the oxygen inhibition effect common to most prior art photopolymerizable compositions sufficiently to adversely affect the light sensitivity of thick coatings of these compositions. Therefore, thick coatings from these compositions need not be exposed in vacuum or with a cover sheet which excludes the presence of oxygen.

Photopolymerizable ethylenically unsaturated monomers which are suitable for use in the compositions of this invention include those which can be represented by the structure:

(I)

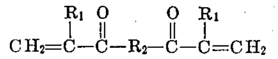

where $R_1$ is hydrogen or methyl, and $R_2$ is a linking group having the structure

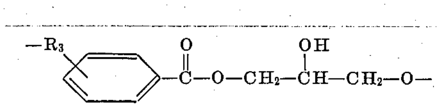

or

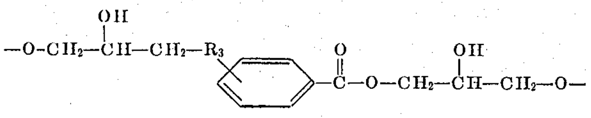

where $R_3$ is oxygen or imino substituted in the para or meta position of the benzene ring.

Representative monomers conforming to structure I include:

2-hydroxy-3-acryloyloxypropyl 4-acryloyloxybenzoate,
2-hydroxy-3-acryloyloxypropyl 3-acryloyloxybenzoate,
2-hydroxy-3-acryloyloxypropyl 4-acrylamidobenzoate,
2-hydroxy-3-acryloyloxypropyl 4-methacryloyloxybenzoate,
2-hydroxy-3-acryloyloxypropyl 3-methacryloyloxybenzoate,
2-hydroxy-3-acryloyloxypropyl 4-methacrylamidobenzoate,
2-hydroxy-3-acryloyloxypropyl 3-methacrylamidobenzoate,
2-hydroxy-3-acryloyloxypropyl 3-(2-hydroxy-3-acryloyloxypropoxy)benzoate,
2-hydroxy-3-acryloyloxypropyl 4-(2-hydroxy-3-acryloyloxypropylamino)benzoate,
2-hydroxy-3-acryloyloxypropyl 3-(2-hydroxy-3-methacryloyloxypropoxy)benzoate,
2-hydroxy-3-acryloyloxypropyl 4-(2-hydroxy-3-methacryloyloxypropoxy)benzoate,
2-hydroxy-3-acryloyloxypropyl 3-(2-hydroxy-3-methacryloyloxypropylamino)benzoate,
2-hydroxy-3-acryloyloxypropyl 4-(2-hydroxy-3-methacryloyloxypropylamino)benzoate,
2-hydroxy-3-methacryloyloxypropyl 4-acryloyloxybenzoate,
2-hydroxy-3-methacryloyloxypropyl 3-acrylamidobenzoate,
2-hydroxy-3-methacryloyloxypropyl 4-methacryloyloxybenzoate,
2-hydroxy-3-methacryloyloxypropyl 3-methacryloyloxybenzoate,
2-hydroxy-3-methacryloyloxypropyl 4-methacrylamidobenzoate,
2-hydroxy-3-methacryloyloxypropyl 3-methacrylamidobenzoate,
2-hydroxy-3-methacryloyloxypropyl 4-(2-hydroxy-3-acryloyloxypropoxy)benzoate,
2-hydroxy-3-methacryloyloxypropyl 3-(2-hydroxy-3-acryloyloxypropylamino)benzoate,
2-hydroxy-3-methacryloyloxypropyl 4-(2-hydroxy-3-methacryloyloxypropoxy)benzoate,
2-hydroxy-3-methacryloyloxypropyl 3-(2-hydroxy-3-methacryloyloxypropoxy)benzoate,
2-hydroxy-3-methacryloyloxypropyl 4-(2-hydroxy-3-methacryloyloxypropylamino)benzoate,
2-hydroxy-3-methacryloyloxypropyl 3-(2-hydroxy-3-methacryloyloxypropylamino)benzoate.

These photopolymerizable monomers can be prepared by condensing a p- or m-hydroxy or aminobenzoic acid with a suitable acrylate reactant or reactants using standard condensation techniques. When both the carboxy group and the hydroxy or amino group on the benzoic acid are to be substituted with the same acryloyl group, a one step reaction is employed in which the benzoic acid is condensed with a reactant such as glycidyl acrylate. This is illustrated by reaction sequence II below. When the carboxy group and the hydroxy or amino group on the benzoic acid are to be substituted with different acryloyl groups, a two-step reaction is employed in which the hydroxy or amino group is first condensed with an acryloyl chloride (which does not react with the carboxy group) and then the carboxy group is condensed with a reactant such as glycidyl acrylate. This is illustrated by reaction sequence III below.

(II)

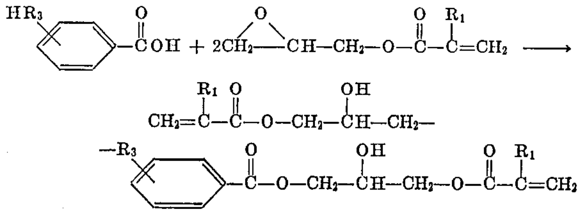

(III) a)

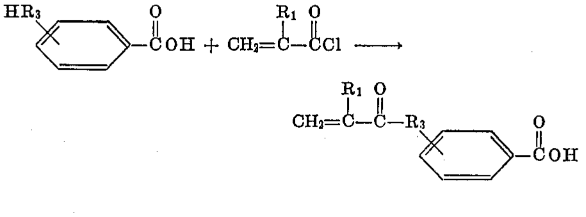

b)

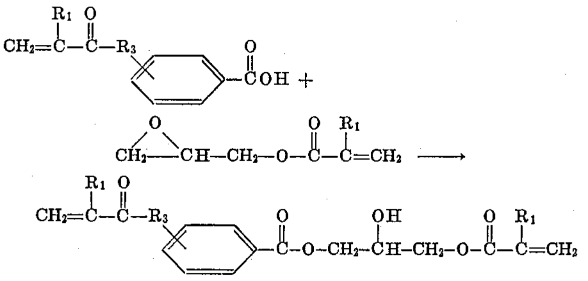

Typically, the one step reaction is carried out at elevated temperatures e.g. 50°–100°C, in the presence of a thermal polymerization inhibitor, e.g., p-methoxy phenol, quinone, hydroquinone, m-dinitrobenzene, phenothiazine, and the like, and a catalyst which will aid cleavage of the glycidyl ring, e.g., tetramethyl ammonium chloride, sodium chloride, sodium hydroxide, sodium bicarbonate, lithium acetate, and the like, and, optionally, in a solvent such as acetone, acetonitrile, tetrahydrofuran, N,N-dimethylformamide, dimethylsulfoxide, and the like. The first step of the two-step reaction is typically carried out at reduced temperatures, e.g., 0°–10°C, in a solvent mixture such as a mixture of methylene chloride with water or pyridine, and in the presence of an acid acceptor such as sodium hydroxide, pyridine, trimethylamine, triethylamine, and the like. The second step of the two step reaction can be performed using the same materials and conditions as the one-step reaction.

While these monomers give useful results in photopolymerizable compositions which do not contain a binder, or in compositions which contain one or more of a variety of film-forming polymeric binders, such as those known in the art for use in photopolymerizable compositions, as well as others, they exhibit the particularly desirable properties referred to above when employed in conjunction with the polymeric binders described below.

The film-forming binders which are particularly useful in the compositions of the present invention are vinyl addition polymers containing free carboxylic acid groups, which are preferably prepared from 30 to 94 mole percent of one or more alkyl acrylates and 70 to 6 mole percent of one or more α, β-ethylenically unsaturated carboxylic acids, and more preferably prepared from 61 to 94 mole percent of two alkyl acrylates and 39 to 6 mole percent of an α, β-ethylenically unsaturated carboxylic acid. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable α, β-ethylenically unsaturated carboxylic acids include acrylic acid, methacrylic acid and the like. Useful film-forming polymeric binders typically have inherent viscosities of from about 0.05 to 2.0 measured in N,N-dimethylformamide, at a concentration of 0.25 grams per deciliter of solution and at a temperature of 25°C. Particularly preferred are polymers having inherent viscosities of about 0.1 to 0.4, similarly measured.

We have discovered quite unexpectedly that terpolymers of methyl methacrylate, ethyl acrylate and methacrylic acid in proportions of from 40 to 65 percent, 20 to 45 percent and 10 to 25 percent, respectively, on a mole basis, produce resist compositions according to our invention of exceptionally clean developing characteristics. Whereas photoresists heretofore known in the art have left microresidues after development, these terpolymer binders can be readily developed to produce areas substantially free of microresidues. These terpolymer binders when incorporated into the photoresist compositions of this invention have, in fact, been found to produce such clean developing characteristics that metal surfaces from which these photoresists have been removed by development with mildly alkaline solutions are satisfactory for subsequent metal plating without resort to any additional chemical or mechanical cleaning procedures. It is unexpected and in contradiction to the established practices of the metal plating art that adherent metal layers can be deposited onto surfaces from which our preferred terpolymer containing photoresist compositions have been developed. Generally when metal layers are attempted to be formed directly onto a surface from which a photoresist has been removed by development and without any further surface treatment, the metal layer either immediately spawls from the surface or forms a very weak bond that can be readily broken. For example, metal layers deposited onto untreated areas formed by developing conventional photoresists can be expected to release readily when a piece of adhesive cellophane tape is applied and then pulled away.

The polymeric binders of our invention can be prepared by any of the addition polymerization techniques known to those skilled in the art, which include solution polymerization, bulk polymerization, bead polymerization, emulsion polymerization, etc., in the presence of a free radical generating polymerization initiator, such as peroxy compounds, e.g., benzoyl peroxide, di(tertiary-amyl) peroxide, or diisopropylperoxy carbonate, azo initiators, e.g., 1,1′-azodicyclohexanecarbonitrile, 2,2′-azobis(2-methylpropionitrile), and the like.

The polymerization reaction can be carried out in the presence of an inert solvent. Preferably, a low molecular weight alcohol which is a good chain transfer agent, e.g., ethyl alcohol, is used to promote formation of lower molecular weight polymers by a solution polymerization technique. Molecular weight can also be controlled by varying the temperature (the higher the initial temperature, the lower the molecular weight) or by varying the amount of catalyst used (the more catalyst, the lower the molecular weight.) Preferably, the polymerization reaction is performed in an inert atmosphere, e.g., under a blanket of nitrogen. The polymerization mixture is maintained at a temperature at which the polymerization initiator generates free radicals. The exact temperature selected depends on the monomers being polymerized, the particular initiator being used, and the molecular weight desired. Temperatures ranging from room temperature or lower up to about 100°C are suitable. It is usually desirable to carry the polymerization reaction substantially to completion so that no unpolymerized monomers remain and the proportions of each component in the final product are essentially those of the original monomer mixture.

The polymeric binder can be collected and purified by conventional techniques, such as precipitation into a nonsolvent for the polymer followed by washing and drying.

The photoactivatable polymerization initiators useful in the compositions of the present invention can be any of the photopolymerization initiators known and employed in the art. Preferably, these compounds are thermally inactive at temperatures encountered during storage and handling of the compositions and elements prepared therewith, i.e., temperatures below about 100°C.

Suitable initiators include aryldiazo sulfones such as those described in Rauner et al U.S. application Ser. No. 46,517, filed June 15, 1970, which also describes suitable sensitizers for these initiators. Other suitable initiators include polynuclear quinones, such as those described in U.S. Pat. No. 3,046,127, e.g., 9,10-anthraquinone, 2-t-butylanthraquinone, 1,4-naphthoquinone, 9,10-phenanthraquinone, 1,2-benzanthraquinone, etc.; vicinal polyketaldonyl compounds, such as are described in U.S. Pat. No. 2,367,660, e.g., diacetyl, benzil, etc., α-ketaldonyl alcohols, such as those described in U.S. Pat. Nos. 2,367,661 and 2,367,670, e.g., benzoin, pivaloin, etc.; acyloin ethers, such as those described in U.S. Pat. No. 2,448,828, e.g., 2-methoxy-2-phenylacetophenone, 2-ethoxy-2-phenyl-acetophenone, etc.; α-hydrocarbon substituted aromatic acyloins, such as are described in U.S. Pat. No. 2,722,512 e.g., α-methyl benzoin, α-allylbenzoin, α-phenylbenzoin, etc.; and the like initiators. Particularly preferred are the synergistic mixtures of initiators described in U.S. Pat. No. 3,427,161, e.g., mixtures of benzophenone, a p,p'-dialkylaminobenzophenone, or fluorenone with a different initiator taken from the group of benzoin, benzoin methyl ether, anthraquinone, 2-methylanthraquinone, benzophenone, benzil, xanthone, 1,3,5-triacetylbenzene, fluorenone, fluorene, diacetyl, propiophenone or benzaldehyde. Particularly preferred is the mixture of benzophenone with p,p'-dimethylaminobenzophenone, also known as Michler's ketone.

The compositions of the present invention can also incorporate thermal polymerization inhibitors to prevent premature polymerization of the composition during storage and handling. Suitable such inhibitors include p-methoxyphenol, hydroquinone, alkyl and aryl-substituted quinones and hydroquinones, t-butylcatechol, pyrogallol, copper resinate, naphthylamines, beta-naphthol, cuprous chloride, 2,6-di-t-butyl p-cresol, phenothiazine, pyridine, nitrobenzene, dinitrobenzene, p-toluquinone, chloranil, and the like.

The coating compositions also can include a variety of photographic addenda utilized for their known purpose, such as agents to modify the flexibility of the coating, agents to modify its surface characteristics, dyes and pigments to impart color to the coating, agents to modify the adhesivity of the coating to the support, antioxidants, preservatives, and a variety of other addenda known to those skilled in the art.

Coating compositions of this invention can be prepared by dispersing or dissolving the constituents in any suitable solvent or combination of solvents used in the art to prepare coating dopes. Solvents that can be used to advantage are volatile organic solvents and include ketones such as 2-butanone, acetone, 4-methyl-2-pentanone, cyclohexanone, 2,4-pentanedione, 2,5-hexanedione, etc.; esters such as 4-butyrolactone, 2-ethoxyethyl acetate, 2-methoxyethyl acetate, etc.; ethers such as 2-methoxy ethanol, 2-ethoxy ethanol, tetrahydrofuran, etc.; and mixtures of these solvents. Typically, the photopolymerizable compounds and the film-forming binder can each be employed in the coating composition in the range of from about 1 to 40 percent by weight, based on the total weight of the coating composition. To produce coatings of exceptionally clean washing characteristics—i.e., capable of being developed in a substantially micro-residue free manner—it is preferred that the monomer be present in the coating composition in a concentration of from 2.5 to 30 percent by weight based on the total weight of the composition and the binder be present in the coating composition in a concentration of from 5 to 40 percent by weight, based on the total weight of the composition. In the photopolymerizable layer which forms an element according to this invention it is preferred that the monomer be present in a concentration of from 16 to 60 percent by weight based on the total weight of the layer while the binder is present in the range of from 35 to 83 percent by weight based on the total weight of the layer. The preferred range of initiator concentration is 5 to 20 percent by weight, based on the weight of the photopolymerizable compound.

Photosensitive elements can be prepared by coating the photosensitive compositions from solvents onto supports in accordance with usual practices. Suitable support materials include fiber-base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic polymeric materials such as polyethylene, polypropylene, poly(alkyl methacrylate), e.g., poly(methyl methacrylate), polyester film base, e.g., poly(ethylene terephthalate), poly(vinyl acetals), polyamides, e.g., nylon, cellulose ester film base, e.g., cellulose nitrate, cellulose acetate, cellulose acetate propionate, cellulose acetate butyrate and the like. The optimum coating thickness for a particular purpose will depend on such factors as the use to which the coating will be put, the particular light-sensitive composition employed, and the nature of other compounds which may be present in the coating. Typical coating thicknesses can be from about 0.1 to 15 mil.

The coating composition can be coated directly on the support on which it is to be used in the preparation of a resist, a printing plate, or the like, or it can be coated on a temporary support and transferred, e.g., by thermal lamination, to the support where it is to be used, either uniformly or in an imagewise fashion. Such transfer techniques are described, for example, in U.S. Pat. Nos. 3,060,023, 3,346,383, 3,469,982 and in U.S. application Ser. Nos. 46,525 and 46,526 filed June 15, 1970.

Photomechanical images can be prepared with photosensitive elements of this invention by imagewise exposing the element to a source of actinic radiation for a period of time sufficient to polymerize and insolubilize material in exposed areas. Exposures of from several seconds to several minutes, or longer, e.g., 10 seconds to 15 minutes, are generally adequate. Suitable light sources that can be employed in exposing the elements include sources rich in visible radiation and sources rich in ultraviolet radiation, such as carbon arc lamps, xenon lamps, mercury vapor lamps, fluorescent lamps, tungsten lamps, lasers and the like.

An image can be developed on the exposed element by such techniques as solvent washout of the unexposed, non-insolubilized areas, by thermal transfer of the unexposed, non-hardened areas, or by other techniques known to those skilled in the art. With solvent washoff techniques, although organic solvents such as those listed above as coating solvents, as well as others, can be employed, the developer solvent is preferably an aqueous alkaline solution. Suitable aqueous developer solutions include aqueous solutions of an alkali metal carbonate, e.g., sodium carbonate; aqueous solutions of an alkali metal hydroxide, e.g., sodium hydroxide; mixtures thereof; aqueous solutions of a lower alcohol, e.g., ethanol, isopropanol, etc., with an alkanolamine, e.g., ethanolamine, propanolamine, 2-diethylaminoethanol, etc.; and the like. The presence of a surfactant in the developer solution aids clean development of the element. The alkaline strength of the developer solution is governed by the particular composition employed. The developer solution can also contain dyes, pigments, and the like. The developed image can then be rinsed with distilled water, dried, and optionally postbaked.

The resulting image can be treated in any known manner consistent with its intended use, such as treatment with desensitizing etchants, plate lacquers, etc., when it is used as a printing plate or treatment with acidic etchants or plating baths when it is used as a resist. After the resist has served its intended purpose it can be readily removed with a strong alkali such as 10 percent sodium hydroxide.

The following examples further illustrate the invention.

EXAMPLE 1

Preparation of 2-Hydroxy-3-methacryloyloxypropyl 4-methacryloyloxybenzoate.

Preparation of 4-Methacryloyloxybenzoic Acid

To 2170 ml of 2 Normal sodium hydroxide solution in a 5 liter, 3-necked round bottomed flask, fitted with a stirrer and condenser, is added 300 grams (2.17 moles) of p-hydroxybenzoic acid, with stirring until solution is effected. The flask is immersed in an ice bath, and the solution temperature reduced to 5°C. The mixture is diluted with 150 milliliters of dichloroethane and then treated dropwise with 226.5 grams (2.17 moles) of methacryloyl chloride while maintaining the temperature between 0°–10°C. When the methacryloyl chloride addition is complete, another 150 milliliters of 1,2-dichloroethane is added rapidly and the ice bath is removed. After stirring 18 hours, the mixture is transferred to a separatory funnel, the aqueous layer removed and acidified by adding 2 liters of 4 percent hydrochloric acid, with stirring. The solid product is collected by filtration, washed on the filter with 2 liters of water, and dried under vacuum at room temperature. Melting point: 183°–185°C. The nmr spectrum of the product is in agreement with the structure of 4-methacryloyloxybenzoic acid.

Preparation of Title Compound

A mixture of 329.3 grams (1.595 moles) of 4-methacryloyloxybenzoic acid, prepared as above, 500 grams (3.51 moles) of glycidyl methacrylate, 14.6 grams (0.133 mole) of tetramethylammonium chloride, and 1.4 grams (0.011 mole) of p-methoxyphenol is placed in a 2 liter, 2-necked flask fitted with a stirrer and condenser and immersed in an 80°C water bath, and stirred for 24 hours. The reaction mixture is cooled to room temperature, diluted with 500 milliliters of 1,2-dichloroethane, filtered through diatomaceous earth, and the filtrate concentrated in a flash evaporator at 40°C. The title compound is obtained as an amber to yellow viscous liquid. The nmr spectrum of the product is consistent with that of the title compound.

EXAMPLE 2

Preparation of 2-Hydroxy-3-Methacryloyloxypropyl 4-Methacrylamidobenzoate.

Prepration of p-Methacrylamidobenzoic Acid

To a mixture of 20 grams (0.146 mole) of p-aminobenzoic acid, 146 milliliters of 2 Normal sodium hydroxide, and 200 milliliters of chloroform in a 1 liter round-bottomed flask cooled in an ice bath, is slowly added with vigorous stirring 16.7 grams (0.16 mole) of methacryloyl chloride while maintaining the temperature at 5° to 10°C. The mixture is stirred in the ice bath an additional 15 minutes, then stirred at room temperature for 30 minutes, and then allowed to stand about 16 hours. The solid is collected and dried. The yield is 26.1 grams of product melting at 222° to 224°C. The nmr spectrum of the product is consistent with the structure of p-methacrylamidobenzoic acid.

Preparation of Title Compound

A mixture of 205.2 grams (1.0 moles) of p-methacrylamidobenzoic acid, prepared as above, 284.3 grams (2.0 moles) of glycidyl methacrylate, 18.3 grams (0.168 mole) of tetramethylammonium chloride, and 2.05 grams of p-methoxyphenol is placed in a 3 liter, 3-necked round-bottomed flask fitted with a thermometer, a condenser, and a stirrer. The flask is immersed in a 60°C water bath and the mixture is stirred slowly to effect solution, then treated with an equal volume of water and stirred at 60°C for 1 hour. While still hot, the organic layer is separated, diluted with methylene chloride, dried over magnesium sulfite, treated with decolorizing carbon, and concentrated under vacuum at 40°C after removing the decolorizing carbon. The title compound is obtained as a dark amber oil (308 grams) which turns to an off-white waxy solid on standing. The structure of the title compound is confirmed by nmr spectroscopy.

EXAMPLE 3

Preparation of 2-Hydroxy-3-Methacryloyloxypropyl p-(2-Hydroxy-3-methacryloyloxypropoxy)benzoate.

In a 300 milliliter flask is mixed 25 grams (0.181 mole) of p-hydroxybenzoic acid, 54.0 grams (0.380 mole) of glycidyl methacrylate, 1.73 grams (0.0158 mole) of tetramethylammonium chloride, and 0.173 grams of p-methoxyphenol. The mixture is heated at 60°C for about 65 hours and extracted with methylene chloride until a clear solution results. The methylene chloride extracts are washed three times with 0.1 molar sodium hydroxide solution, three times with distilled water, and then dried over magnesium sulfate, the solvent removed by evaporation, and the title compound collected as a viscous oil weighing 36.8 grams. The structure is confirmed by nmr spectroscopy.

EXAMPLE 4

Preparation of 1,4-Bis(methacryloyloxymethyl)-cyclohexane.

To a mixture of 25 grams (0.173 mole) of 1,4-cyclohexanedimethanol, 37.8 grams (0.346 mole) of triethylamine and 40 milliliters of methylene chloride in a 300 milliliter round-bottomed flask cooled with ice water is slowly added 36.2 grams (0.346 mole) of methacryloyl chloride while maintaining the temperature below 32°C. An additional 40 milliliters of methylene chloride is added during the methacryloyl chloride addition. After the addition is completed, the mixture is stirred at room temperature for 2 hours and at 42°C for another 2 hours. The mixture is cooled, the salt removed by filtration, the filtrate washed three times with water, twice with dilute hydrochloric acid, twice more with water, twice with dilute hydrochloric acid, twice more with water, dried over magnesium sulfate and the methylene chloride removed by distillation under reduced pressure to provide the title compound as an oil product weighing 21.1 grams. The structure is confirmed by nmr spectroscopy.

| | | |
|---|---|---|
| Anal. Calcd: | C, 68.54; | H, 8.63 |
| Found: | C, 66.8 ; | H, 8.6. |

Preparation of 1,3-Dimethacryloyloxy-2,2,4,4-tetramethylcyclobutane.

To a mixture of 25 grams (0.173 mole) of 2,2,4,4-tetramethylcyclobutane-1,3-diol, 41.5 grams (0.38 mole) of triethylamine, and 160 milliliters of methylene chloride in a 500 ml round-bottomed flask is added 39.7 grams (0.38 mole) of methacryloyl chloride at a rate which maintains the temperature below 40°C. After the addition is completed, the mixture is stirred at room temperature for 4 hours and then at 40°–50°C for about 16 hours. The mixture is cooled, the triethylamine hydrochloride salt removed by filtration, the filtrate washed three times with water, twice with dilute hydrochloric acid, three more times with water, then dried over magnesium sulfate, the solvent removed by evaporation, and the title compound collected as 44.1 grams of an amber liquid.

| | | |
|---|---|---|
| Anal. Calcd: | C, 68.54; | H, 8.63 |
| Found: | C, 65.6; | H, 8.2. |

Preparation of 1,4-Bis(2-methacryloxyethoxy)-benzene

To a mixture of 19.8 grams (0.10 mole) of 1,4-bis(2-hydroxyethoxy)-benzene, 21.8 grams (0.20 mole) of triethylamine and 40 ml of dry methylene chloride in a 300 milliliter three-necked flask cooled in an ice water bath is slowly added 20.9 grams (0.20 mole) of methacryloyl chloride while maintaining the temperature below 30°C. On completion of the addition, another 40 milliliters of methylene chloride is added and the mixture is stirred 3.5 hours at room temperature and 2 hours at 42°C. After cooling, the salt is removed by diluting to 300 milliliters total volume with methylene chloride, washing twice with dilute hydrochloric acid and twice more with water. The solution is dried over magnesium sulfate, the solvent removed by evaporation, and the title compound collected as 30.1 grams of a white solid melting at 69°–72°C.

| | | |
|---|---|---|
| Anal. Calcd: | C, 64.66; | H, 6.63 |
| Found: | C, 64.6 ; | H, 6.6. |

Preparation of 2-Hydroxy-3-methacryloyloxypropyl 2-Methacrylamidopropionate

Preparation of 2-Methacrylamidopropionic Acid

To a mixture of 80 grams of sodium hydroxide in 200 milliliters of water and 44.55 grams (0.5 mole) of DL-alanine in a 500 milliliter round-bottomed flask immersed in an ice-isopropanol bath and maintained at −5° to 0°C is added 52.2 grams (0.5 mole) of methacryloyl chloride over a period of 1.5 hours. The flask is removed from the cooling bath and allowed to stand 1 hour. The mixture is acidified with concentrated hydrochloric acid and the precipitated product collected. Two more crops are obtained by concentrating the mother liquor. The three crops are combined and extracted with benzene to provide 13.3 grams of a white solid melting at 120°–122°C. The structure of the product is confirmed by infrared analysis.

Preparation of the Title Compound

A mixture of 5 grams (0.319 mole) of 2-methacrylamidopropionic acid, 9.1 grams (0.0638 mole) of glycidyl methacrylate, 0.6 grams (0.00534 mole) of tetramethylammonium chloride, and 0.06 grams of p-methoxyphenol is stirred for 18 hours in a 300 ml three-necked round-bottomed flask fitted with a stirrer, condenser and thermometer while immersed in a 50°C water bath. The mixture is diluted with 50 milliliters of methylene chloride, washed three times with 25 milliliter portions of 1 percent sodium hydroxide solution, washed twice with water, dried over magnesium sulfate, filtered, and the filtrate concentrated in a flash evaporator at 30°C. A yield of 8.0 grams of the title product is obtained. The structure is confirmed by nmr spectroscopy.

| | | | |
|---|---|---|---|
| Anal. Calcd: | C, 56.4; | H, 7.1; | N, 4.7 |
| Found: | C, 54.4; | H, 6.8; | N, 2.8 |

Synthesis of Poly(methylmethacrylate-co-ethyl acrylate-co-methacrylic acid) (59:25:16-mole ratio)

A flask, equipped with nitrogen inlet tube, stirrer, and reflux condenser, is charged with a solution containing 316 grams (3.156 mole) methyl methacrylate, 135.3 grams (1.351 mole) ethyl acrylate, 73.5 grams (0.8538 mole) methacrylic acid, 4725 milliliters ethyl alcohol, and 2.62 grams 2,2'-azobis(2-methylpropionitrile). The system is purged with nitrogen for 20 minutes before adding the catalyst. The flask is placed in an 80°C bath and allowed to heat, with stirring, under nitrogen for 17 hours. The resulting clear polymer solution is slightly viscous. The polymer is precipitated and washed by pouring the reaction mixture into cold water and then dried at 50°C under vacuum. Inherent viscosity is 0.20, measured in N,N-dimethylformamide (0.25 grams/-deciliter solution at 25°C.).

| | |
|---|---|
| Anal. Calcd. for $C_{256}H_{389}O_{106}$: | C, 59.39; H, 7.91 |
| Found: | C, 59.6; H, 8.1. |

EXAMPLE 9

Synthesis of Poly(Methyl methacrylate-co-ethyl acrylate-co-methacrylic acid) (27.3:63.5:9.2-mole ratio)

The procedure of Example 4 is followed except that the solution contained 13.8 grams (0.138 mole) methyl methacrylate, 32.2 grams (0.32 mole) ethyl acrylate, 4.0 grams (0.047 mole) methacrylic acid, 450 milliliters ethanol, and 0.25 gram 2,2'-azobis(2-methylpropionitrile).

EXAMPLE 10

Synthesis of Poly(ethyl acrylate-co-acrylic acid) (32.5:67.5 - mole ratio)

The procedure of Example 4 is followed except the solution contains 40 grams (0.4 mole) ethyl acrylate, 60 grams (0.83 mole) acrylic acid, 500 milliliters acetone and 0.25 gram 2,2'-azobis(2-methylpropionitrile). The reaction is operated at a temperature of 60°C for 16 hours. The polymer is isolated as in Example 4.

EXAMPLE 11

Synthesis of Poly(butyl acrylate-co-acrylic acid) (86:14 - mole ratio)

The procedure of Example 6 is followed except that the solution contains 90 grams (0.79 mole) butyl acrylate, 10 grams (0.14 mole) acrylic acid, 300 milliliters acetone and 0.5 gram 2,2'-azobis(2-methylpropionitrile).

EXAMPLE 12

Synthesis of Five Poly(Methyl Methacrylate-co-Ethyl Acrylate-co-Methacrylic Acid) Terpolymers A mixture of 439.2 g of methyl methacrylate, 284.4 g of ethyl acrylate, 116.4 g of methacrylic acid and 7500 ml of ethanol is placed in a 12 liter flask, degassed for one hour with nitrogen gas and immersed in a constant temperature bath at 80°C. With stirring, a solution of 4.2 g of 2,2'-azobis(2-methyl-propionitrile) in about 340 ml of ethanol is added in 3 portions, each portion followed by a rinse of 40 ml of ethanol.

The mixture is stirred at reflux for 20 hours. The volume is reduced to half by distillation of solvent, and the concentrated solution is poured into 25 to 30 gallons of water. The liquid is then decanted, and the solid is washed once with water, collected by filtration, and dried in a polyethylene bag under vacuum for 4 days with a nitrogen gas bleed at 40°C, then in a vacuum for 3 days. The resulting polymer, identified as Terpolymer C in Table I, provided a yield of 700 g with an inherent viscosity of 0.20 in N,N-dimethylformamide measured in a concentration of 0.25 g per deciliter at 25°C. Terpolymer C consists essentially of 50 percent methyl methacrylate, 34 percent ethyl acrylate and 16 percent methacrylic acid, based on mole percentages. Terpolymers A, B, D and E also set forth in Table I were similarly prepared, but with differing proportions of methyl methacrylate and ethyl acrylate monomers as indicated.

TABLE I

| Terpolymer | Mole % Monomer: Methyl Methacrylate | Mole % Monomer: Ethyl acrylate | Inherent Viscosity |
|---|---|---|---|
| A | 34 | 50 | 0.14 |
| B | 42 | 42 | 0.20 |
| C | 50 | 34 | 0.20 |
| D | 59 | 25 | 0.21 |
| E | 67 | 17 | 0.22 |

EXAMPLE 13

Photopolymerizable Composition

A composition is prepared from the following components:

1 gram of the polymeric binder prepared in Example 8, 1 gram of the monomer, 2-hydroxy-3-methacryloyloxypropyl-4-methacryloyloxybenzoate, prepared in Example 1

0.1 gram of benzophenone 0.1 gram of Michler's ketone 5 milliliters of tetrahydrofuran.

The above composition is applied to a 2.5 mil copperclad epoxy board at a wet-thickness of 10 mil. The coating is airdried for 5 minutes and baked at 90°C for 15 minutes. The coating is imagewise exposed to a xenon light source, and a resist image is developed by spraying with a 4 percent sodium carbonate solution for 60 seconds, followed by a water rinse and air drying. The circuit board is etched for 60 minutes with a ferric chloride etchant, and at the end of this time the resist image has not broken down. This demonstrates the suitability of the photoresist in forming structures such as printed circuits and the like. By withstanding the ferric chloride etchant the photoresist protects the copper which it overlies. The remaining copper is removed by the etchant. After etching the circuit board is washed with water and the resist is stripped from the board with 10 percent sodium hydroxide. The copper cladding is left intact in those areas covered by photoresist before removal by the sodium hydroxide. The copper cladding remaining could, for example, form conductive paths for a printed circuit.

Similar compositions are prepared from the monomers of Examples 1 to 3 and the binders of Examples 9 to 11. These compositions are used to prepare resist images, by development in dilute alkali, which stand up well in acidic etchants.

EXAMPLE 14

Comparison of Photopolymerizable Compositions for Microresidue Free Development Characteristics Bright copper supports are surface deoxidized by immersion in a 3 percent by volume sulfuric acid solution. The supports are then rinsed and dried. The Terpolymers A, B, C, D and E set forth in Table I are incorporated in photoresist compositions otherwise identical to that set forth in Example 13. Five separate photoresist compositions are prepared each incorporating a different terpolymer binder. After air drying for 5 minutes at room temperature the coated supports are baked for 5 minutes at 90°C. Each resist coating is exposed through a Kodak Control Scale T-14, which is a 14 step density scale ranging from a density of 0.04 (step 1) to 2.05 (step 14) at 0.15 increments. The resist image is developed by spraying with a 4 percent sodium carbonate solution for 60 seconds, followed by water rinse and air drying. To insure that no oxides are present on the copper surfaces exposed during development these exposed areas are washed with a 3 percent sulfuric acid solution and rinsed with water. Since sulfuric acid does not etch copper, no metal is removed during this step nor are microresidues of photoresist, if present, removed. Copper is plated onto the exposed areas of the supports using a copper sulfate plating bath. Properties of the processed supports are summarized in Table II.

TABLE II

| Terpolymer | Speed | Development | Cleanout |
|---|---|---|---|
| A | 8 | Excellent | Excellent |
| B | 8 | Excellent | Excellent |
| C | 8 | Excellent | Excellent |
| D | 7 | Very good | Excellent |
| E | 7 | Very poor | Very poor |

The supports coated with Terpolymers A, B, C and D all give acceptable development properties. The support coated with Terpolymer D need somewhat longer contact with the developer to obtain equivalent removal of the resist coating. For this reason the spraying of the support coating containing Terpolymer D is extended 30 seconds. The supports coated with Terpolymers A, B, C and D and developed as indicated are all substantially free of microresidues that interfere with plated copper adhesion. In each of the elements the plated copper tenaciously adheres to the cleaned surface without etching. In the case of the support coated with Terpolymer E, spraying does not achieve development of the photoresist. Development can be achieved, however, by swabbing. Thus, the Terpolymer E coating is considered a useful resist coating, but not a preferred resist coating, since swabbing can damage the image definition and is impractical for very intricate or fine patterns. The coating containing Terpolymer A exhibits very high speed together with excellent development and cleanout properties. This terpolymer is not preferred, however, since it exhibits a somewhat lower degree of solidity after exposure as compared to the remaining coatings. The preferred coatings all exhibited excellent speed characteristics. The speed is reported in terms of the number of steps which developed.

This invention has been described in detail with particular reference to preferred embodiments thereof, but it will be understood that variations and modifications can be effected within the spirit and scope of the invention.

What is claimed is:

1. A photopolymerizable composition comprising a. an ethylenically unsaturated monomer which is a bisacrylate of a p- or m-hydroxy or amino benzoic acid, b. a film-forming carboxylated polymeric binder, and c. a photoactivatable polymerization initiator.

2. A composition of claim 1 wherein the film-forming binder is a polymer of 30 to 94 mole percent of one or more alkyl acrylates and 70 to 6 mole percent of one or more $\alpha$, $\beta$-ethylenically unsaturated carboxylic acids.

3. A composition of claim 1 wherein the ethylenically unsaturated monomer is a bismethacrylate of a p-hydroxy benzoic acid.

4. A composition of claim 1 wherein the ethylenically unsaturated monomer has the structure $$CH_2=\overset{R_1}{\overset{|}{C}}-\overset{O}{\overset{\|}{C}}-R_2-\overset{O}{\overset{\|}{C}}-\overset{R_1}{\overset{|}{C}}=CH_2$$

where:

$R_1$ is hydrogen or alkyl of one to four carbon atoms, and $R_2$ is a linking group having the structure

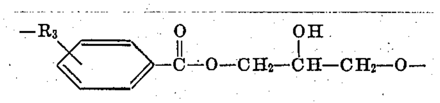

or

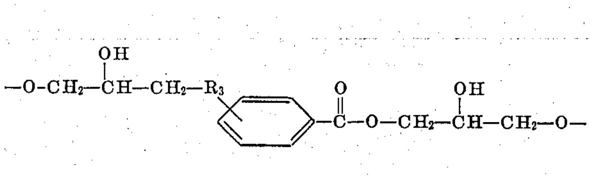

where $R_3$ is oxygen or imino substituted in the para or meta position of the benzene ring.

5. A composition of claim 4 where the ethylenically unsaturated monomer is 2-hydroxy-3-methacryloyloxypropyl 4-methacryloyloxybenzoate.

6. A composition of claim 4 where the ethylenically unsaturated monomer is 2-hydroxy-3-methacryloyloxypropyl p-(2-hydroxy-3-methacryloyloxypropoxyl)benzoate.

7. A composition of claim 4 where the polymeric binder is a polymer of 61 to 94 mole percent of two alkyl acrylates and 39 to 6 mole percent of an $\alpha$, $\beta$-ethylenically unsaturated carboxylic acid.

8. A composition of claim 1 wherein the photoactivatable polymerization initiator is a mixture of benzophenone and Michler's ketone.

9. A composition according to claim 1 wherein the film-forming binder is a terpolymer of methyl methacrylate, ethyl acrylate and methacrylic acid.

10. A photopolymerizable composition comprising a solution in an organic solvent of a. 1 to 40 percent by weight of an ethylenically unsaturated monomer having the structure $$CH_2=C(R_1)-C(=O)-R_2-C(=O)-C(R_1)=CH_2$$

where:
- $R_1$ is hydrogen or alkyl of one to four carbon atoms, and
- $R_2$ is a linking group having the structure

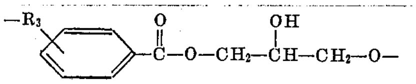

or

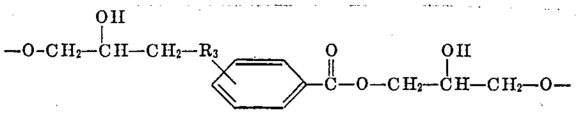

where $R_3$ is oxygen or imino substituted in the para or meta position of the benzene ring.

b. 1 to 40 percent by weight of a film-forming polymeric binder which is a polymer of 61 to 94 mole percent of two alkyl acrylates and 39 to 6 mole percent of an α, β-ethylenically unsaturated carboxylic acid; and c. from 5 to 20 percent by weight, based on the weight of the ethylenically unsaturated monomer, of a photoactivatable polymerization initiator.

11. A photopolymerizable composition comprising a solution in an organic solvent capable of producing coatings having clean developing characteristics comprising a. 2.5 to 30 percent by weight of an ethylenically unsaturated monomer having the structure $$CH_2=C(R_1)-C(=O)-R_2-C(=O)-C(R_1)=CH_2$$

wherein:
- $R_1$ is hydrogen or alkyl of one to four carbon atoms, and
- $R_2$ is a linking group having the structure

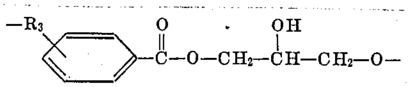

or

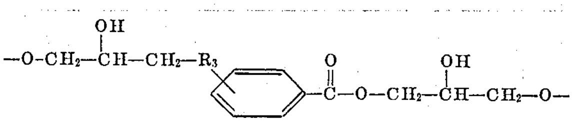

where $R_3$ is oxygen or imino substituted in the para or meta position of the benzene ring;

b. 5 to 40 percent by weight of a film-forming polymeric binder which is a polymer of from 40 to 65 percent methyl methacrylate, 20 to 45 percent ethyl acrylate and 10 to 25 percent, methacrylic acid, on a mole basis; and c. from 5 to 20 percent by weight, based on the weight of the ethylenically unsaturated monomer, of a photoactivatable polymerization initiator.

12. An element comprising
a support and
a layer of a photopolymerizable composition comprising a. an ethylenically unsaturated monomer which is a bisacrylate of a p- or m-hydroxy or amino benzoic acid, b. a film-forming carboxylated polymeric binder, and c. a photoactivatable polymerization initiator.

13. An element according to claim 12 in which the film-forming binder is a polymer of 30 to 94 mole percent of one or more alkyl acrylates and 70 to 6 mole percent of one or more ethylenically unsaturated carboxylic acids.

14. An element according to claim 12 in which the ethylenically unsaturated monomer has the structure $$CH_2=C(R_1)-C(=O)-R_2-C(=O)-C(R_1)=CH_2$$

where:
- $R_1$ is hydrogen or alkyl of one to four carbon atoms, and
- $R_2$ is a linking group having the structure

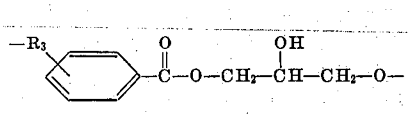

or

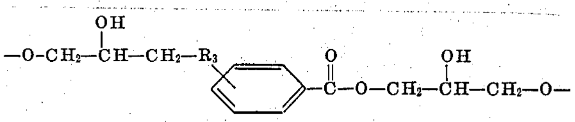

where $R_3$ is oxygen or imino substituted in the para or meta position of the benzene ring.

15. An element comprising
a support and
a layer of a photopolymerizable composition having clean development characteristics comprising a. 16 to 60 percent by weight of an ethylenically unsaturated monomer having the structure $$CH_2=C(R_1)-C(=O)-R_2-C(=O)-C(R_1)=CH_2$$

wherein:
- $R_1$ is hydrogen or alkyl of one to four carbon atoms, and
- $R_2$ is a linking group having the structure

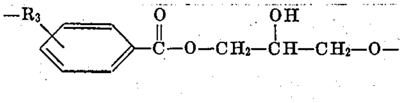

or

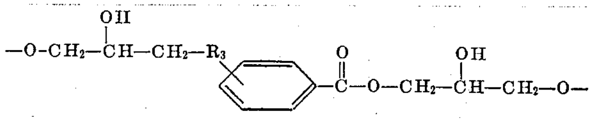

where $R_3$ is oxygen or imino substituted in the para or meta position of the benzene ring;

b. 35 to 83 percent by weight of a film-forming polymeric binder which is a polymer of from 40 to 65 mole percent methyl methacrylate, 20 to 45 mole percent ethyl acrylate and 10 to 25 mole percent methacrylic acid; and c. from 5 to 20 percent by weight, based on the weight of the ethylenically unsaturated monomer, of a photoactivatable polymerization initiator.

16. An element according to claim 15 in which said support presents a metal surface adjacent said photopolymerizable layer.

17. An element according to claim 15 in which said support presents a copper surface adjacent said photopolymerizable layer.

* * * * *

PO-1050
(5/69)

UNITED STATES PATENT OFFICE
CERTIFICATE OF CORRECTION

Patent No. 3,833,384 Dated September 3, 1974

Inventor(s) John M. Noonan; Richard C. Sutton and Robert C. McConkey

It is certified that error appears in the above-identified patent and that said Letters Patent are hereby corrected as shown below:

Column 11, line 46, insert -- Example 5--.

Column 12, before line 1 insert --Example 6--.
Column 12, before line 25 insert --Example 7--.

Column 13, before line 1, insert --Example 8--.

Signed and sealed this 6th day of May 1975.

(SEAL)
Attest:

RUTH C. MASON
Attesting Officer

C. MARSHALL DANN
Commissioner of Patents
and Trademarks